United States Patent [19]

Kimura et al.

[11] Patent Number: 4,956,340
[45] Date of Patent: Sep. 11, 1990

[54] PROCESS FOR PREPARING COMPOUND METAL OXIDES OF YTTRIUM, BARIUM AND COPPER

[75] Inventors: Etsuji Kimura, Kasukabe; Nozomu Hasegawa, Omiya; Yutaka Nishiyama, Kagawa, all of Japan

[73] Assignee: Mitsubishi Kinzoku Kabsuhiki Kaisha, Tokyo, Japan

[21] Appl. No.: 432,316

[22] Filed: Nov. 3, 1989

Related U.S. Application Data

[63] Continuation of Ser. No. 227,234, Aug. 1, 1988, abandoned.

[30] Foreign Application Priority Data

Jul. 31, 1987 [JP] Japan ................................. 62-190201

[51] Int. Cl.$^5$ ...................... C01F 11/02; C01F 17/00; C01G 3/02
[52] U.S. Cl. ......................................... 505/1; 423/593; 423/263; 423/265; 423/337; 423/604; 423/636; 423/639; 502/252; 502/355; 501/94; 501/123; 501/126; 501/152; 505/735; 505/737; 505/738; 505/780; 252/51; 252/521
[58] Field of Search ................ 423/604, 636, 639, 337, 423/263, 593, 265; 502/252, 355; 501/123, 126, 152, 94; 505/1, 735, 737, 738, 780; 252/51, 521

[56] References Cited

U.S. PATENT DOCUMENTS 4,886,777  12/1989  Kimura et al. ....................... 423/263

OTHER PUBLICATIONS

Japanese Journal of Applied Physics, vol. 26, No. 5, May 1987, pp. L836–L837, Saito et al, "Super Conductivity of Sr—La—Cu Oxides Prepared by Coprecipitation Method", Materials and Processing Report, vol. 2, No. 10, 1988, pp. 1–9.
Proceeding of Symposium S of the 1987 Spring Meeting of Mat. Res. Soc., vol. EA-11, Morris et al, "Mobile Oxygen and Isotope Effects in the High Temperature Superconductive YBa$_2$Cu$_3$O$_7$".
"Manufacture and Testing of High Tc–Super Conducting Materials", Yarat et al, Advanced Ceramic Materials, vol. 2, No. 3B, 1987, pp. 372–379.
Advanced Ceramic Materials, vol. 2, No. 3B, 1987, Cina et al, "Powder Processing for Microstructural Control in Ceramic Superconductors", pp. 329–336.
Advanced Ceramic Materials, vol. 2, No. 3B, 1987, pp. 656–661, "Thermal Analysis of Ba$_2$YCu$_3$O$_{7-x}$ at 700°–1000° C. in Air", Cook et al.
Mat. Res. Soc. Symp. Proc., vol 99, 1988, "Advantages of Barium Peroxide in the Powder Synthesis of Perovskite Super Conductors", pp. 615–618, Hepp et al.
Japanese Journal of Applied Physics, vol. 26, No. 5, 1987, pp. 1736–1737, Kawai et al, "Preparation of High–Tc Y—Ba—Cu—O Superconductor".
Japanese Journal of Applied Physics, vol. 26, Nos. 7–1987, pp. L1159–L1160, Fujiki et al, "Preparation of a High—Tc Y—Ba—Cu—O Super Conductor Using Coloidal Method".
Z. Phys. B. Condensed Matter 64, 189–193, 1986, Bednorz et al, "Possible High Tc Superconductivity in the Ba—La—Cu—O System."
Materials Research Society Symposium Proceedings, vol. 99, High Temperature Superconductors, Kayser et al., "Preparation of High Tc YBa$_2$Cu$_3$O$_{7-x}$ Powders from Nitrate and Oxalate Precursors", 1988, pp. 159–164.
Materials Research Society Symposium Proceedings, vol. 99, High Temperature Superconductors, Voigt et al., "A Hydroxycarbonate Route to Superconductor Precursor Powders", 1988, pp. 635–638.
Japanese Journal of Applied Physics, vol. 26, No. 5, May 1987, "Single Crystal preparation of Ba$_2$YCu$_3$O$_x$ from NonStoichiometric Melts", Takekaw et al., L851–853.
Japanese Journal of Applied Physics, vol. 26, No. 4, Apr. 1987, pp. L498–501, "X–Ray and Electron Microscopic Study of a High Temperature Super Conductor, etc."
Chemistry of High–Temperature Super Conductors, Chapter 7, Davison et al; and Chapter 11, Holland et al., American Chemical Society, 1987, pp. 65–78 and 102–113.
Japanese Journal of Applied Physics, vol. 26, No. 5, May 1987, pp. L858–859.
Materials and Processing Report, "Update Report on High Tc Superconductors", vol. 2, No. 4, Jul. 1987, pp. 1–4.

*Primary Examiner*—R. Dean
*Assistant Examiner*—Paige C. Harvey
*Attorney, Agent, or Firm*—Oblon, Spivak, McClelland, Maier & Neustadt

[57] ABSTRACT

A process for preparing compound metal oxides, superconductive compound oxides, is disclosed. The process comprises preparing an aqueous solution containing a predetermined content ratio of chloride, nitrate or acetate of a rare earth metal, an alkaline earth metal and copper, said content ration corresponding to the composition of the object compound metal oxide, adjusting the pH of the solution to 1.5–2.0, adding oxalic acid in an amount such that the concentration of the residual oxalic acid becomes 0.05 M/l–0.1 M/l, collecting the thus formed precipitate and firing it.

8 Claims, No Drawings

PROCESS FOR PREPARING COMPOUND METAL OXIDES OF YTTRIUM, BARIUM AND COPPER

This application is a continuation of Ser. No. 227,234, filed on Aug. 1, 1988, now abandoned.

FIELD OF THE INVENTION

This invention relates to a process for preparing compound metal oxides using a specific chemical steps therefor. More specifically, this invention relates to a specific process for preparing compound metal oxides of specific compositions which are useful as superconductor materials, oxygen sensors, catalysts, etc. Especially, compound metal oxides of a rare earth metal, an alkaline earth metal and copper have recently drawn attention as superconductor materials which exhibit superconductivity at temperatures over 77K.

BACKGROUND OF THE INVENTION

As methods for preparing compound metal oxides, therehave been known processes in which (1) Oxides, carbonates or oxalates of the respective component metals are physically mixed in the state of powder, the mixture is fired and pulverized;

(2) Water-soluble salts such as nitrates of the respective components metals are dissolved in water to make a homogeneous solution, the metals are coprecipitated as insoluble oxalates by addition of oxalate ions, and the precipitate is collected and fired into a compound metal oxide; etc.

In process (1), powders are mixed and fired. Therefore, the reaction proceeds from the contact boundaries of powder particles and there remain some unreacted portions. Thus the product often deviates in compositions from that intended.

In process (2), the condition of precipitation differs from metal to metal, and, therefore, a precipitate containing a rare earth metal, an alkaline earth metal and copper, for instance, in the content ratio exactly the same as the content ratio in the solution is not always formed. Therefore, compound metal oxides of compositions different from that intended are inevitably formed.

In process (2), a method in which precipitation of oxalate by addition of oxalate ions is caused at a pH of around 5 is preferably employed. Even in this method, however, sometimes compound metal oxides the composition of which deviates by several tens % from the intended composition are produced, and thus a compound metal oxide of the intended composition cannot be produced regularly and reproducibility.

This invention relates to an improvement of the above-described conventional coprecipitation process. Disadvantages of conventional coprecipitation processes are diminished by causing coprecipitation of a rare earth metal, an alkaline earth metal and copper from a mixed solution of chloride, nitrate or acetate of these metals by adding oxalic acid in a specified pH range.

SUMMARY OF THE INVENTION

This invention provides a process for preparing a compound metal oxide of a rare earth metal, an alkaline earth metal and copper comprising preparing an aqueous solution containing a predetermined content ratio of chloride, nitrate or acetate of a rare earth metal, an alkaline earth metal and copper, said content ratio corresponding to the composition of the object compound metal oxide, adjusting the pH of the solution to 1.5-2.0, preferably 1.75-2.0, adding oxalic acid in such amount that the concentration of the residual oxalic acid becomes 0.05M/1-0.1M/1, collecting the thus formed precipitate and firing it.

In the process of the present invention, the term "rare earth metal" means Sc, Y, La, Ce, Pr, Nd, Pm, Sm, Eu, Gd, Tb, Dy, Ho, Er, Tm, Yb and Lu.

In the present invention, the term "alkaline earth metal" means Be, Mg, Ca, Sr and Ba.

The process of the present invention is carried out as follows. Salts (chloride, nitrate or acetate) of a rare earth metal, an alkaline earth and copper are mixed in a predetermined content ratio, and dissolved in water, to which an acid can be added to assist dissolution if necessary. Oxalic acid is added to the solution in such amount that the concentration of the residual oxalic acid becomes 0.05M/1-0.1M/1 under sufficient agitation lest a copper complex should be locally formed, and finally the pH of the mixture is adjusted to 1.5-2.0 by addition of ammonia. If the pH is less than 1.5, the alkaline earth metal is not easily precipitated, and if it is in excess of 2.0, copper is not easily precipitated.

The formed precipitate is collected and fired. Preferably, firing is carried out as follows. The collected precipitate is compacted and the compact is calcined at a temperature of 400°-900° C. and roasted under an oxygen partial pressure of at least the same as in air or higher. Thus the desired compound metal oxide is obtained.

The point of the present invention does not reside in the step of firing but in the step of precipitation.

By the process of the present invention, compound metal oxides the compositions of which deviates less from the intended composition than by the conventional process can be prepared.

SPECIFIC DESCRIPTION OF THE INVENTION

The process of the present invention and the use of the products will be explained by way of working examples.

EXAMPLE 1

5.646 g of $Y_2O_3$ (99.99% purity)
20.682 g of $BaCO_3$ (99.9% purity) and
12.508 g of CuO (99.9% purity)
were dissolved in 30 ml of concentrated nitric acid, and the solution was diluted to 1 liter. The solution was warmed to 70° C., and poured into 2.25 l of a 0.3 mol/l solution of oxalic acid. While the mixed solution was stirred, ammoniacal water was added dropwise so as to adjust the pH of the solution to 1-2.5. The solution was further stirred for 30 minutes while the temperature was kept at 15°-20° C. The formed precipitate was filtered by suction and dried at 50° C. for 15 hours. Precipitates were formed under various pH's and the obtained precipitates were analyzed for the content of Y, Ba and Cu. The results are indicated in Table 1.

TABLE 1

| Sample No. | pH | Y | Ba | Cu |
|---|---|---|---|---|
| | | (molar ratio) | | |
| 1 | 1.0 | 1 | 1.46 | 3.10 |
| 2 | 1.5 | 1 | 2.02 | 3.01 |
| 3 | 1.75 | 1 | 1.99 | 3.00 |
| 4 | 2.0 | 1 | 2.00 | 2.99 |
| 5 | 2.5 | 1 | 2.20 | 2.41 |

The dried precipitate was calcined at 900° C. for 15 hours in the atmosphere. The obtained powder was formed into pellets, which were heated at 930° C. for 5 hours in the atmosphere. Thereafter, the pellets were cooled in the furnace at the rate of 100° C./hr. The thus obtained pellets were chilled with liquid helium, and electric conductivity was measured and the temperature from which electric resistance dropped sharply and the temperature at which the resistance became zero were determined. The results are indicated in Table 2.

TABLE 2

| | Superconductivity | |
|---|---|---|
| Sample No. | Temp. from which electric resistance drops sharply | Temp. at which electric resistance becomes zero |
| 1 | 90K | 81K |
| 2 | 98K | 97K |
| 3 | 99K | 98K |
| 4 | 99K | 98K |
| 5 | 89K | 78K |

COMPARATIVE EXAMPLE

A precipitate was formed from the same solution as used in Example 1 by adjusting the pH thereof to 5, and a compound oxide was prepared by calcining and roasting the precipitate in the same manner. In this case, however, the precipitation of copper was poor, the molar ratio Y:Ba:Cu was 1:2. 01:2. 02, and its electric conductivity did not reach zero even at temperatures below 70K.

We claim:

1. A process for preparing a compound oxide of yttrium, barium and copper, comprising preparing an aqueous solution containing said yttrium, barium and copper in a content ratio corresponding to the composition of said compound oxide, adding oxalic acid to said aqueous solution to obtain a precipitate, and adjusting the pH of said aqueous solution to a value of 1.5 to 2.0, wherein said oxalic acid is added in an amount such that 0.05M/l to 0.1M/l of oxalate ions remain after precipitation of said yttrium, barium, and copper, and wherein the ratio yttrium:barium:copper in said solution is about 1:2:3, and collecting and firing said precipitate to obtain a compound oxide in which the ratio of yttrium, barium and copper, respectively, is about 1:2:3.

2. The process of claim 1, wherein the pH of said aqueous solution is adjusted to 1.75-2.0.

3. The process of claim 1, wherein said aqueous solution is prepared by dissolving yttrium oxide, barium carbonate, and copper oxide in an acid.

4. The process of claim 1, wherein said acid is nitric acid.

5. The process of claim 1, wherein said adjusting the pH is conducted by adding ammonia.

6. The process of claim 1, wherein said firing comprises compacting said collected precipitate, to obtain a compact; calcining said compact, to obtain a calcined compact; and roasting said calcined compact.

7. The process of claim 6, wherein said calcining is conducted at a temperature of from 400°-900° C.

8. The process of claim 6, wherein said roasting is conducted in an atmosphere with an oxygen partial pressure of at least that of air.

* * * * *